(12) United States Patent
Bryant et al.

(10) Patent No.: US 8,604,546 B1
(45) Date of Patent: Dec. 10, 2013

(54) REDUCING GATE RESISTANCE IN NONPLANAR MULTI-GATE TRANSISTOR

(75) Inventors: Andres Bryant, Burlington, VT (US); Theodorus E. Standaert, Clifton Park, NY (US); Gen Tsutsui, Albany, NY (US); Chun-Chen Yeh, Clifton Park, NY (US)

(73) Assignees: International Business Machines Corporation, Armonk, NY (US); Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/544,176

(22) Filed: Jul. 9, 2012

(51) Int. Cl.
*H01L 27/12* (2006.01)
*H01L 21/336* (2006.01)

(52) U.S. Cl.
USPC ............ 257/347; 257/E27.112; 257/E21.409; 438/197

(58) Field of Classification Search
None
See application file for complete search history.

(56) References Cited

U.S. PATENT DOCUMENTS

| | | | |
|---|---|---|---|
| 5,411,906 A | 5/1995 | Johnson et al. | |
| 6,680,224 B2 | 1/2004 | Shin et al. | |
| 6,734,510 B2 | 5/2004 | Forbes et al. | |
| 6,888,198 B1 | 5/2005 | Krivokapic | |
| 6,897,517 B2 | 5/2005 | Van Houdt et al. | |
| 6,919,601 B2 | 7/2005 | Inaba | |
| 6,936,882 B1 | 8/2005 | Ahmed et al. | |
| 7,045,456 B2 | 5/2006 | Murto et al. | |
| 7,148,537 B2 | 12/2006 | Matsuzawa | |
| 7,148,546 B2 | 12/2006 | Visokay et al. | |
| 7,314,802 B2 | 1/2008 | Zhu et al. | |
| 7,560,756 B2 | 7/2009 | Chau et al. | |
| 7,859,065 B2 | 12/2010 | Takeuchi et al. | |
| 7,879,661 B2 | 2/2011 | Tsuzumitani | |
| 2005/0093082 A1* | 5/2005 | Son et al. | 257/401 |
| 2005/0272190 A1 | 12/2005 | Lee et al. | |
| 2006/0172476 A1 | 8/2006 | Liao et al. | |
| 2007/0052010 A1 | 3/2007 | Hsu et al. | |
| 2009/0212366 A1 | 8/2009 | Chang et al. | |
| 2011/0089493 A1 | 4/2011 | Lander | |

* cited by examiner

*Primary Examiner* — Michael Lebentritt
*Assistant Examiner* — Kevin Quinto
(74) *Attorney, Agent, or Firm* — Gibb & Riley, LLC; Michael J. LeStrange, Esq.

(57) ABSTRACT

A semiconductor transistor structure has a plurality of fins, a cap on the center portion of the top of each of the fins, a conductive liner lining the cap and the sidewalls of the center portion of the fins, and an insulator between the center portions of the fins. The insulator contacts the conductive liner, and the fins extend further from the surface of the substrate relative to an amount the insulator extends from the surface of the substrate. The structure further includes a conductive layer positioned on the insulator between the center portions of the fins and positioned between the cap of the fins. The conductive layer contacts the conductive liner.

20 Claims, 3 Drawing Sheets

REDUCING GATE RESISTANCE IN NONPLANAR MULTI-GATE TRANSISTOR

BACKGROUND

The present disclosure relates to transistor structures, and more specifically, to reducing gate resistance in multiple gate fin-type transistor structures.

Integrated circuit devices often include transistors that are useful in making and breaking electrical connections. One type of transistor utilizes one or more fins that extend from a substrate. The center of the fin usually makes up the channel region of the transistor and the outer ends of the fin make up the source and drain regions. A gate commonly passes over the central region of the fin, and controls the operation of transistor. Additional structures sometimes use multiple fins and multiple gates.

One issue that is encountered relates to the resistance of the gate conductor. Even 2-dimensional transistor devices experience gate conductor resistance related to the length or width of the gate conductor. However, because of the 3-dimensional nature of fin type transistors, the resistance of the gate conductor is even more pronounced, because the height of the gate conductor produces an additional resistance component.

SUMMARY

One exemplary embodiment herein comprises a semiconductor transistor structure having a plurality of fins extending in a first direction from the surface of the substrate. The fins have a length dimension perpendicular to the first direction, have end portions at opposing ends of the length dimension, and have a center portion positioned along the length dimension between the ends. Each of the fins has a bottom contacting the surface of the substrate and a top opposite the bottom, and the fins further have sidewalls between the top and the bottom. The structure further includes a cap on the center portion of the top of each of the fins, a conductive liner lining the cap and the sidewalls of the center portion of the fins, and a polysilicon layer between the center portions of the fins. The polysilicon layer contacts the conductive liner, and the fins extend in the first direction further from the surface of the substrate relative to an amount the polysilicon layer extends from the surface of the substrate (in the first direction). The structure further includes a conductive layer positioned on the polysilicon layer between the center portions of the fins and positioned between the cap of the fins. The conductive layer contacts the conductive liner.

Another embodiment herein comprises a semiconductor transistor structure having a plurality of fins extending in a first direction from the surface of the substrate. The fins again have a length dimension perpendicular to the first direction, end portions at opposing ends of the length dimension, and a center portion positioned along the length dimension between the ends. Similarly, each of the fins has a bottom contacting the surface of the substrate and a top opposite the bottom, and the fins further have sidewalls between the top and the bottom. The structure further includes a cap on the center portion of the top of each of the fins, a conductive liner lining the cap and the sidewalls of the center portion of the fins, and an insulator between the center portion of the fins. The insulator contacts the conductive liner, and the fins extend in the first direction further from the surface of the substrate relative to an amount the insulator extends from the surface of the substrate (in the first direction). The structure further includes a conductive layer positioned on the insulator between the center portion of the fins and positioned between the cap of the fins. The conductive layer contacts the conductive liner.

Exemplary embodiments herein further include a method of forming a semiconductor transistor structure. The exemplary method patterns a plurality of fins to extend in a first direction from a surface of a substrate. The fins are patterned to have a length dimension perpendicular to the first direction, and are patterned to have end portions at opposing ends of the length dimension and a center portion positioned along the length dimension between the ends. Each of the fins is further patterned to have a bottom contacting the surface of the substrate and a top opposite the bottom, and the fins are further patterned to have sidewalls between the top and the bottom. The method then patterns a cap on the center portion of the top of each of the fins. The method also lines the cap and the sidewalls of the center portion of the fins with a conductive liner. The method forms a polysilicon layer between the center portion of the fins. The polysilicon layer is formed to contact the conductive liner. The fins are formed to extend in the first direction further from the surface of the substrate relative to an amount the polysilicon layer extends from the surface of the substrate in the first direction. The method also forms a conductive layer positioned on the polysilicon layer between the center portion of the fins and positioned between the cap of the fins. The conductive layer is formed to contact the conductive liner.

BRIEF DESCRIPTION OF THE DRAWINGS

The embodiments herein will be better understood from the following detailed description with reference to the drawings, which are not necessarily drawn to scale in which.

DETAILED DESCRIPTION

As mentioned above, one issue that is encountered relates to the resistance of the gate conductor, and this issue is even more pronounced in 3-dimensional fin-type (multigate or trigate) transistors. In view of this, the structures and methods described below increase the thickness of the silicide (and correspondingly decrease the thickness of the polysilicon portion) of the gate conductor in order to allow the silicide to naturally form a conductive strap with the conductive liner surrounding the exterior of the fin/cap structure.

Figure 1:
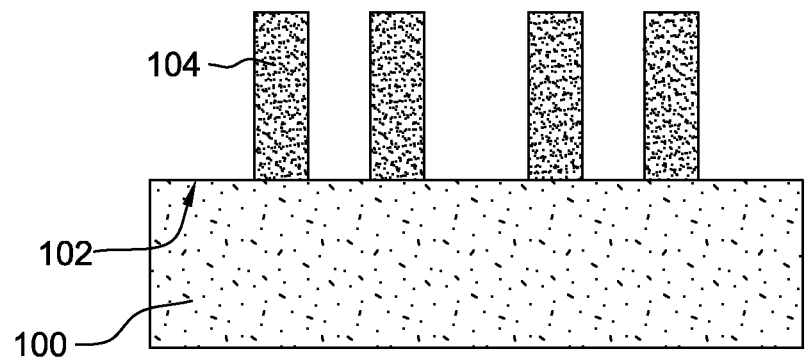
FIG. 1 is a schematic cross-sectional diagram illustrating various features of embodiments herein.

Exemplary embodiments herein further include a method of forming a semiconductor transistor structure. As shown in FIG. 1, the exemplary method patterns a plurality of semiconductor fins 104 to extend in a "first direction" upward from the surface 102 of a substrate 100. A "substrate" herein can comprise any material appropriate for the given purpose (whether now known or developed in the future) and can comprise, for example, Si, SiC, SiGe, strained Silicon, etc., or organic structures, etc. In some embodiments, the substrate 100 can include a buried oxide layer (BOX) that isolates the surface 102 from any bias the other portions of the substrate 100 may provide.

Further, for purposes herein, a "semiconductor" is a material or structure that may include an impurity (inherent or implanted) that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern. Further, as understood by those ordinarily skilled in the art, sidewall spacer patterning (so-called sidewall image transfer) can further reduce the size of items patterned.

Figure 5:
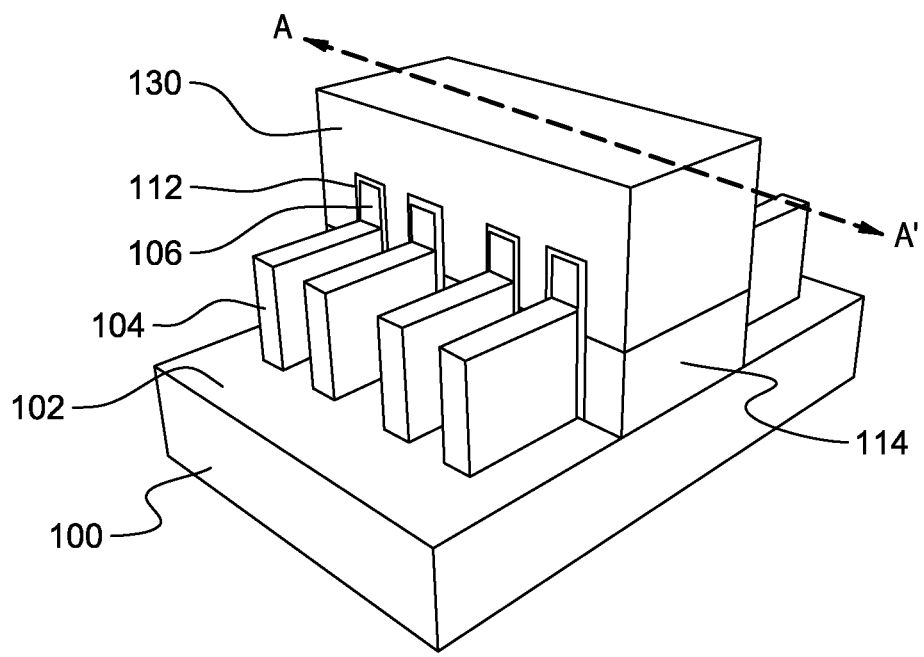
FIG. 5 is a schematic perspective diagram illustrating various features of embodiments herein.

As shown in perspective view in FIG. 5, the fins 104 are rectangular boxes, and are therefore patterned to have a length dimension perpendicular to the first direction coming upward out of the substrate surface 102. Further, being rectangular boxes, the fins 104 are patterned to have end portions at opposing ends of the length dimension and a center portion positioned along the length dimension between the ends. Each of the fins 104 is further patterned to have a bottom contacting the surface 102 of the substrate 100 and a top opposite the bottom, and the fins 104 are further patterned to have sidewalls between the top and the bottom. Eventually, the end portions will be doped into conductors (e.g., source/drain regions); while the center portion will remain a semiconductor (e.g., channel region).

Figure 2:
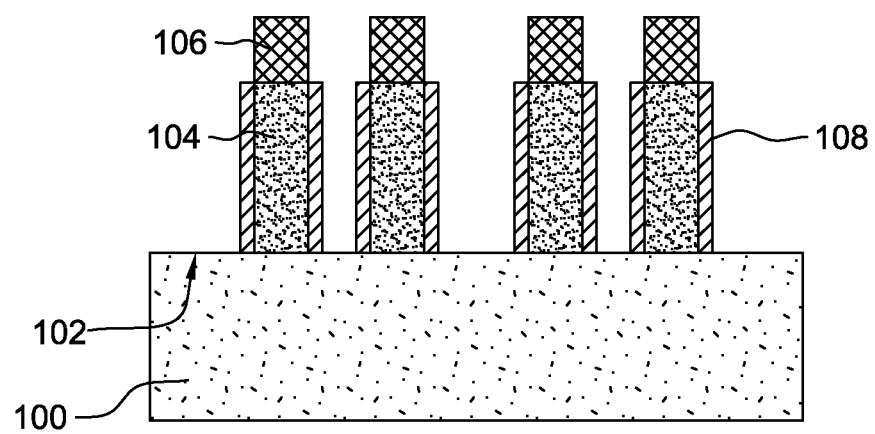
FIG. 2 is a schematic cross-sectional diagram illustrating various features of embodiments herein.

The method then patterns a cap 106 (out of, for example, a hardmask material) on the center portion of the top of each of the fins 104, as shown in FIG. 2. A hardmask can be formed of any suitable material, whether now known or developed in the future, such as a metal or organic hardmask or insulator (such as silicon oxide or silicon nitride), that has a hardness greater than the substrate and insulator materials used in the remainder of the structure.

At some point in the process, a gate oxide (or other form of insulator such as high-k material, HfO2, La2O3, Al2O3 . . . etc) 108, shown arbitrarily being formed in FIG. 2, is formed or grown on the center portion of the fins 104 to insulate the center portion of the semiconductive fins 104 and allow the center portion of the fins to act as channel regions. Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

Figure 3:
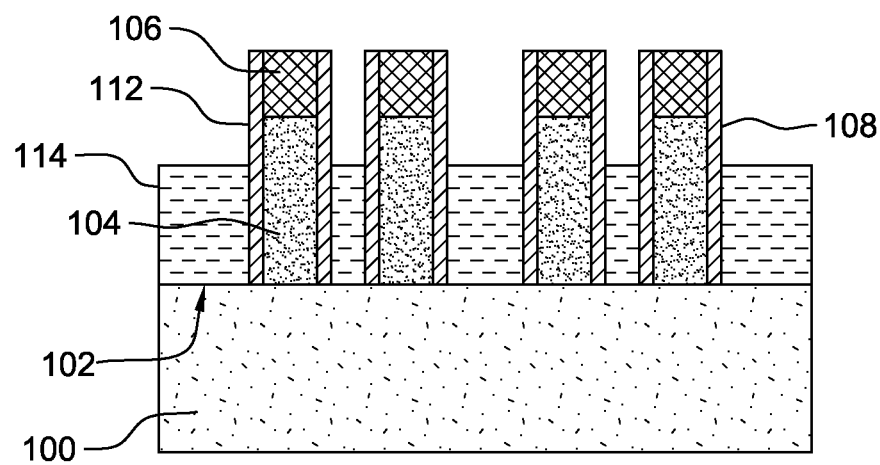
FIG. 3 is a schematic cross-sectional diagram illustrating various features of embodiments herein.

As shown in FIG. 3, the method also lines the cap 106 and the gate oxide 108 on the sidewalls of the center portion of the fins 104 with a conductive liner 112. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant such as Arsenic, Phosphorous or Boron. Alternatively, the conductors herein may be one or more metals, such as tungsten, hafnium, tantalum, molybdenum, titanium, or nickel, or a metal silicide, any alloys of such metals (or nitrides, chlorides, etc., of such metals), and may be deposited using physical vapor deposition, chemical vapor deposition, atomic layer deposition or any other technique known in the art.

As further shown in FIG. 3, the methods herein form a layer 114 between the center portion of the fins 104. This layer 114 can be a conductor, such as polysilicon, or can be an insulator, and the layer 114 can comprise a high stress material. The layer 114 is formed to contact the conductive liner 112 and the substrate surface 102, as shown most clearly in FIG. 2.

As shown in the drawings, during the various patterning steps herein, the fins 104 are formed to extend in the first direction further from the surface 102 of the substrate 100 relative to an amount the layer 114 extends from the surface 102 of the substrate 100 in the first direction. Therefore, for example, the layer 114 can be reduced in thickness so that it is shorter than the height of the fins 104 (or at least short enough so that a portion of the liner 112 is exposed above the layer 114).

For example, if the layer 114 is an insulator (such as an oxide), the growth of the oxide can be controlled so that the height of the layer 114 above the substrate surface 102 is less than the height of the fins 104. Alternatively, if the layer 114 is a deposited silicon or polysilicon material, the amount that is deposited can be controlled so that the height of the layer 114 above the substrate surface 102 is less than the height of the fins 104.

Figure 4:
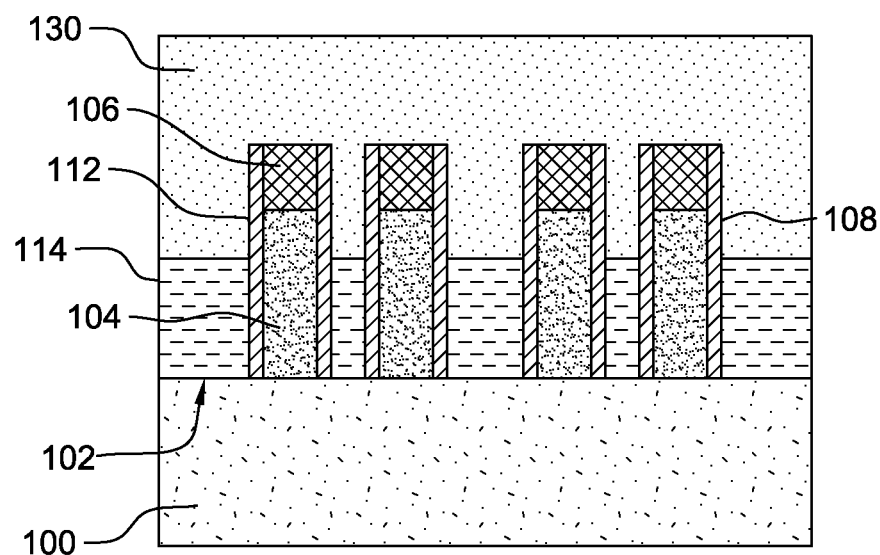
FIG. 4 is a schematic cross-sectional diagram illustrating various features of embodiments herein.

As also shown in FIG. 4, the method patterns a conductive layer 130 positioned on the layer 114 between the center portions of the fins 104 and positioned between the cap 106 of the fins 104. The conductive layer 130 (and possibly the layer 114, if layer 114 is a conductor) forms a gate conductor of the transistor.

Further, the conductive layer 130 can be a silicide of the layer 114 such as NiSi, CoSi . . . etc. As is understood by those ordinarily skilled in the art, a silicide is formed by depositing metal on a silicon material, and subsequently heating the metal to cause the silicon and metal to combine into a silicide. The siliciding process used to form the conductive layer 130 can be designed to consume enough of the underlying (silicon) layer 114 to reduce the height of the layer 114 to allow the conductive layer 130 to come into direct contact with the conductive liner 112, thereby forming a strap with the conductive liner 112.

Thus, the conductive layer 130 is formed to directly contact the conductive liner 112. As shown, the conductive liner 112 extends along a full height of the sidewalls of the center portion of the fins 104, from the bottom to the top of the fins 104. The conductive liner 112 is also shown to contact the surface 102 of the substrate 100. FIG. 5 illustrates the same structure in perspective view.

Figure 6:
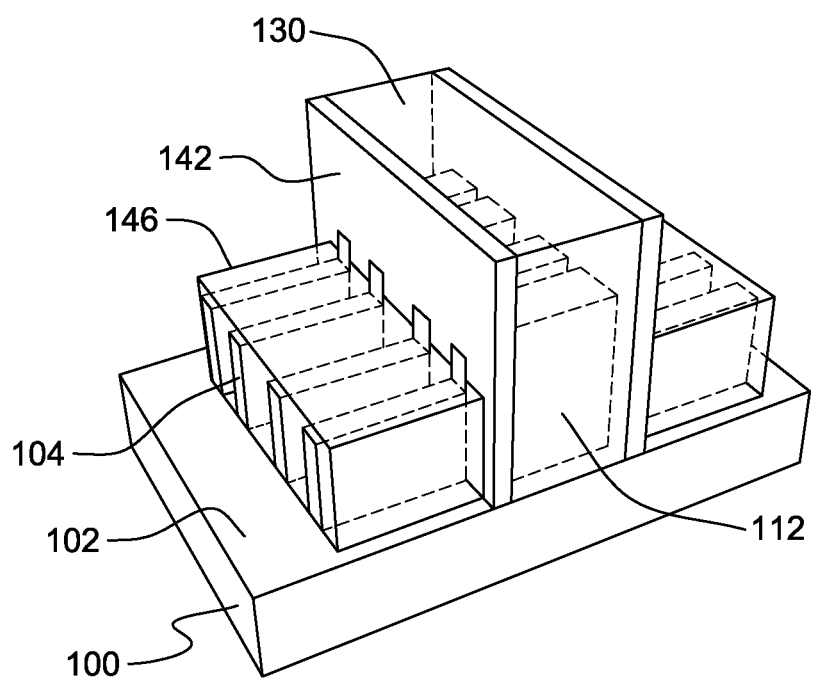
FIG. 6 is a schematic perspective diagram illustrating various features of embodiments herein.

FIG. 6 illustrates the formation of a gate spacer 142 (which can be radiation hardened) and the formation of another conductor 146 which electrically joins the end portions of the fins 104 to form common source/drain regions. In FIG. 6, the gate conductor 130 and source/drain strap 146 are shown in transparent view to allow the underlying structures to be seen more easily.

Therefore, this process forms a semiconductor transistor structure having a plurality of fins 104 extending in a first direction from the surface 102 of the substrate 100. The fins 104 again have a length dimension perpendicular to the first direction, end portions at opposing ends of the length dimension, and a center portion positioned along the length dimension between the ends. Similarly, each of the fins 104 has a bottom contacting the surface 102 of the substrate 100 and a top opposite the bottom, and the fins 104 further have sidewalls between the top and the bottom.

The structure further includes a cap 106 on the center portion of the top of each of the fins 104, a conductive liner 112 lining the cap 106 and the sidewalls of the center portion of the fins 104, and an insulator between the center portion of the fins 104. The insulator contacts the conductive liner 112, and the fins 104 extend in the first direction further from the surface 102 of the substrate 100 relative to an amount the insulator extends from the surface 102 of the substrate 100 (in the first direction). The structure further includes a conductive layer 130 positioned on the insulator between the center portion of the fins 104 and positioned between the cap 106 of the fins 104. The conductive layer 130 contacts the conductive liner 112.

The methods described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of transistors are illustrated in the drawings, those ordinarily skilled in the art would understand that many different types of transistors could be simultaneously formed with the embodiment herein, and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor transistor structure comprising:
   a substrate;
   a plurality of fins extending in a first direction from a surface of said substrate, said fins having a length dimension perpendicular to said first direction, said fins having end portions at opposing ends of said length dimension and a center portion positioned along said length dimension between said ends, each of said fins having a bottom contacting said surface of said substrate and a top opposite said bottom, and said fins further having sidewalls between said top and said bottom;
   a cap on said center portion of said top of each of said fins;
   a conductive liner lining said cap and said sidewalls of said center portion of said fins;
   a polysilicon layer between said center portion of said fins, said polysilicon layer contacting said conductive liner, said fins extending in said first direction further from said surface of said substrate relative to an amount said polysilicon layer extends from said surface of said substrate in said first direction; and
   a conductive layer positioned on said polysilicon layer between said center portion of said fins and positioned between said cap of said fins,
   said conductive layer contacting said conductive liner.

2. The semiconductor transistor structure according to claim 1, said conductive layer comprising a silicide.

3. The semiconductor transistor structure according to claim 1, said polysilicon layer comprising a high stress material.

4. The semiconductor transistor structure according to claim 1, said polysilicon layer comprising a doped silicon material.

5. The semiconductor transistor structure according to claim 1, said conductive liner extending along a full height of said sidewalls of said center portion of said fins from said bottom to said top of said fins.

6. The semiconductor transistor structure according to claim 1, said conductive liner contacting said surface of said substrate.

7. The semiconductor transistor structure according to claim 1, further comprising a gate insulator between said fins and said conductive liner.

8. A semiconductor transistor structure comprising:
   a substrate;
   a plurality of fins extending in a first direction from a surface of said substrate, said fins having a length dimension perpendicular to said first direction, said fins having end portions at opposing ends of said length dimension and a center portion positioned along said length dimension between said ends, each of said fins having a bottom contacting said surface of said substrate and a top opposite said bottom, and said fins further having sidewalls between said top and said bottom;
   a cap on said center portion of said top of each of said fins;
   a conductive liner lining said cap and said sidewalls of said center portion of said fins;
   an insulator between said center portion of said fins, said insulator contacting said conductive liner, said fins extending in said first direction further from said surface of said substrate relative to an amount said insulator extends from said surface of said substrate in said first direction; and
   a conductive layer positioned on said insulator between said center portion of said fins and positioned between said cap of said fins,
   said conductive layer contacting said conductive liner.

9. The semiconductor transistor structure according to claim 8, said conductive layer comprising a silicide.

10. The semiconductor transistor structure according to claim 8, said insulator comprising a high stress material.

11. The semiconductor transistor structure according to claim 8, said insulator comprising a silicon material.

12. The semiconductor transistor structure according to claim 8, said conductive liner extending along a full height of said sidewalls of said center portion of said fins from said bottom to said top of said fins.

13. The semiconductor transistor structure according to claim 8, said conductive liner contacting said surface of said substrate.

14. The semiconductor transistor structure according to claim 8, further comprising a gate insulator between said fins and said conductive liner.

15. A method of forming a semiconductor transistor structure comprising:
   patterning a plurality of fins to extend in a first direction from a surface of a substrate, said fins being patterned to have a length dimension perpendicular to said first direction, said fins being patterned to have end portions at opposing ends of said length dimension and a center portion positioned along said length dimension between said ends, each of said fins being patterned to have a bottom contacting said surface of said substrate and a top opposite said bottom, and said fins further being patterned to have sidewalls between said top and said bottom;
   patterning a cap on said center portion of said top of each of said fins;
   lining said cap and said sidewalls of said center portion of said fins with a conductive liner;
   forming a polysilicon layer between said center portion of said fins, said polysilicon layer being formed to contact said conductive liner, said fins being formed to extend in said first direction further from said surface of said substrate relative to an amount said polysilicon layer extends from said surface of said substrate in said first direction; and
   forming a conductive layer positioned on said polysilicon layer between said center portion of said fins and positioned between said cap of said fins,
   said conductive layer being formed to contact said conductive liner.

16. The method of forming a semiconductor transistor structure according to claim 15, said conductive layer comprising a silicide.

17. The method of forming a semiconductor transistor structure according to claim 15, said polysilicon layer comprising a high stress material.

18. The method of forming a semiconductor transistor structure according to claim 15, said conductive liner extending along a full height of said sidewalls of said center portion of said fins from said bottom to said top of said fins.

19. The method of forming a semiconductor transistor structure according to claim 15, said conductive liner being formed to contact said surface of said substrate.

20. The method of forming a semiconductor transistor structure according to claim 15, further comprising forming a gate insulator between said fins and said conductive liner.

* * * * *